(12) United States Patent
Zhang

(10) Patent No.: US 12,395,137 B2
(45) Date of Patent: Aug. 19, 2025

(54) ELECTRONIC DEVICE AND POWER SUPPLY METHOD FOR SMART POWER AMPLIFIER

(71) Applicant: HONOR DEVICE CO., LTD., Shenzhen (CN)

(72) Inventor: Lixin Zhang, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 0 days.

(21) Appl. No.: 18/034,837

(22) PCT Filed: Dec. 27, 2022

(86) PCT No.: PCT/CN2022/142500
§ 371 (c)(1),
(2) Date: May 1, 2023

(87) PCT Pub. No.: WO2023/197684
PCT Pub. Date: Oct. 19, 2023

(65) Prior Publication Data
US 2024/0204735 A1    Jun. 20, 2024

(30) Foreign Application Priority Data

Apr. 12, 2022 (CN) .......................... 202210380301.6

(51) Int. Cl.
| | |
|---|---|
| *H03F 3/21* | (2006.01) |
| *H02J 7/00* | (2006.01) |
| *H02J 7/34* | (2006.01) |
| *H02J 50/10* | (2016.01) |
| *H02J 50/12* | (2016.01) |

(Continued)

(52) U.S. Cl.
CPC ................. *H03F 3/21* (2013.01); *H04R 3/00* (2013.01); *H04R 29/001* (2013.01);
(Continued)

(58) Field of Classification Search
None
See application file for complete search history.

(56) References Cited

U.S. PATENT DOCUMENTS

| | | | |
|---|---|---|---|
| 2021/0273475 A1 | 9/2021 | Qiu et al. | |
| 2022/0037903 A1* | 2/2022 | Mackay | ................ H01M 10/44 |

(Continued)

FOREIGN PATENT DOCUMENTS

| | | |
|---|---|---|
| CA | 3166343 A1 | 7/2021 |
| CN | 107682551 A | 2/2018 |

(Continued)

*Primary Examiner* — Qin Zhu
(74) *Attorney, Agent, or Firm* — WOMBLE BOND DICKINSON (US) LLP

(57) ABSTRACT

An electronic device and a power supply method for a smart power amplifier are provided. The electronic device includes a battery, a switch circuit, a boost circuit, a smart power amplifier, a speaker, and a controller. The battery is connected to a first end of the switch circuit, a second end of the switch circuit is connected to an input end of the smart power amplifier, a third end of the switch circuit is connected to an input end of the boost circuit, an output end of the boost circuit is connected to the input end of the smart power amplifier, and an output end of the smart power amplifier is connected to the speaker. The boost circuit is configured to perform boost conversion on an output voltage of the battery.

12 Claims, 7 Drawing Sheets

(51) Int. Cl.
　　　*H02M 1/00*　　　(2007.01)
　　　*H02M 3/156*　　　(2006.01)
　　　*H02M 3/158*　　　(2006.01)
　　　*H02M 7/44*　　　(2006.01)
　　　*H02M 7/48*　　　(2007.01)
　　　*H04R 3/00*　　　(2006.01)
　　　*H04R 29/00*　　　(2006.01)

(52) U.S. Cl.
　　　CPC .... *H03F 2200/03* (2013.01); *H04R 2201/028* (2013.01); *H04R 2430/01* (2013.01)

(56) References Cited

U.S. PATENT DOCUMENTS

| | | |
|---|---|---|
| 2022/0078548 A1 | 3/2022 | Dang et al. |
| 2022/0376540 A1 | 11/2022 | Liu et al. |
| 2023/0188156 A1* | 6/2023 | Perry ................. H04R 1/005 341/144 |
| 2023/0238887 A1* | 7/2023 | Lim ................. H02M 1/0095 |

FOREIGN PATENT DOCUMENTS

| | | | |
|---|---|---|---|
| CN | 109742824 A | 5/2019 | |
| CN | 111614329 A | 9/2020 | |
| CN | 111836164 A | 10/2020 | |
| CN | 113676140 A | 11/2021 | |
| CN | 113949167 A | 1/2022 | |
| CN | 114245271 A | 3/2022 | |
| WO | 2020019300 A1 | 1/2020 | |
| WO | WO-2023154218 A1 * | 8/2023 | ............... G05F 1/10 |

* cited by examiner

ELECTRONIC DEVICE AND POWER SUPPLY METHOD FOR SMART POWER AMPLIFIER

CROSS-REFERENCE TO RELATED APPLICATIONS

This application is a national stage of International Application No. PCT/CN2022/142500 filed on Dec. 27, 2022, which claims priority to Chinese Patent Application No. 202210380301.6 filed on Apr. 12, 2022. The disclosures of both of the aforementioned application are hereby incorporated by reference in their entireties.

TECHNICAL FIELD

This application relates to the field of terminal technologies, and in particular, to an electronic device and a power supply method for a smart power amplifier.

BACKGROUND

With continuous development of technologies, upgrading of electronic devices is accelerating. As an important performance index of the electronic devices, audio performance is also a key field of development and upgrading of the technologies.

A combination of a smart power amplifier (Smart Power Amplifier, Smart PA) and a speaker (Speak, SPK) is a main development direction of the industry, which can effectively improve a series of performance such as loudness and sound quality of audio played by an electronic device.

The Smart PA is powered by a battery of the electronic device. When the Smart PA works, a voltage at an input end needs to be greater than or equal to a working voltage of the Smart PA; otherwise the Smart PA stops working. When an electric quantity of the battery is low or the electronic device is in a cold environment, an output voltage of the battery drops. In this case, in some scenarios, if a playback volume suddenly increases or a playback sound resource is in a high-pitched stage, output power required by the speaker increases instantaneously. In other words, instantaneous power that needs to be outputted by the Smart PA increases, so that a current that needs to be outputted by the battery also increases instantaneously. However, due to impedance on a line between the battery and a voltage input end of the Smart PA, when the current that needs to be outputted by the battery increases, an instantaneous divided voltage of the impedance increases, causing a voltage connected to the voltage input end of the Smart PA to drop. If the voltage at the voltage input end of the Smart PA drops below the working voltage, the Smart PA is triggered to stop working. As a result, the speaker cannot continue to work normally, and noise or interruption occurs in an audio playback scenario.

SUMMARY

To resolve the foregoing problems, this application provides an electronic device and a power supply method for a smart power amplifier, which can prevent noise or interruption from occurring in audio playback when an output voltage of a battery is low.

According to a first aspect, this application provides an electronic device. The electronic device includes a battery, a switch circuit, a boost circuit, a Smart PA, a speaker, and a controller. The battery is connected to a first end of the switch circuit, a second end of the switch circuit is connected to an input end of the Smart PA, a third end of the switch circuit is connected to an input end of the boost circuit, an output end of the boost circuit is connected to the input end of the Smart PA, and an output end of the Smart PA is connected to the speaker; the boost circuit is configured to perform boost conversion on an output voltage of the battery; and the controller is configured to control, in a case that the output voltage of the battery is greater than or equal to a preset voltage, the first end of the switch circuit to be in communication with the second end of the switch circuit; and control, in a case that the output voltage of the battery is less than the preset voltage, the first end of the switch circuit to be in communication with the third end of the switch circuit, where the preset voltage is greater than a minimum working voltage of the Smart PA.

In the solution provided in this application, when an output voltage of a battery is greater than or equal to a preset voltage, the battery directly supplies power to a Smart PA; and when the output voltage of the battery is less than the preset voltage, a boost (Boost) circuit first boosts the output voltage of the battery, and then supplies power to the Smart PA by using the boosted voltage, to ensure that a voltage at an input end of the Smart PA is always greater than or equal to the preset voltage, that is, always greater than a minimum voltage required by the Smart PA to maintain normal working, to prevent the Smart PA from being triggered to stop working due to an insufficient input voltage. Therefore, in the solution of this application, a case such as noise or interruption can be prevented from occurring in an audio playback scenario when an electric quantity of the battery is low or an electronic device is in a low-temperature environment, thereby improving listening experience of a user.

In a possible implementation, an output end of an inverter circuit is connected to a power transmit coil. The boost circuit is further configured to perform boost conversion on the output voltage of the battery and send the output voltage after the boost conversion to the inverter circuit; and the power transmit coil is configured to convert an alternating current outputted by the inverter circuit into an alternating magnetic field. In other words, the electronic device has a function of reversely supplying power to an external device. In this case, the electronic device may perform time division duplexing on the boost circuit, that is, may be used to resolve a problem of play back noise when the battery has a low temperature and a low electric quantity, and avoid an additional setting of the boost circuit, thereby reducing space and hardware costs.

In a possible implementation, the switch circuit includes a single pole double throw switch; a movable end of the single pole double throw switch is connected to the first end of the switch circuit, a first non-movable end of the single pole double throw switch is connected to the second end of the switch circuit, and a second non-movable end of the single pole double throw switch is connected to the third end of the switch circuit; and the controller is further configured to control, in a case that the output voltage of the battery is greater than or equal to the preset voltage, the movable end to be in communication with the first non-movable end; and control, in a case that the output voltage of the battery is less than the preset voltage, the movable end to be in communication with the second non-movable end.

In a possible implementation, the switch circuit includes a first switch and a second switch. A first end of the first switch is connected to the second end of the switch circuit, a second end of the first switch and a second end of the second switch are connected to the first end of the switch circuit, and a first end of the second switch is connected to the third end of the switch circuit. The controller is further configured to control, in a case that the output voltage of the battery is greater than or equal to the preset voltage, the first switch to be on, and the second switch to be off; and control, in a case that the output voltage of the battery is less than the preset voltage, the first switch to be off, and the second switch to be on.

In a possible implementation, in a case that an output volume of the speaker is a maximum volume, a divided voltage on a transmission line between the Smart PA and the battery is a first voltage, and the preset voltage is greater than or equal to a sum of the minimum working voltage of the Smart PA and the first voltage, to ensure that the Smart PA can always work normally. The first voltage may be calibrated by testing.

In a possible implementation, the preset voltage is in a positive correlation with an output volume of the speaker. The preset voltage of this manner is adjustable. Therefore, a time for which the boost circuit accesses can be reduced, thereby prolonging an endurance time of the battery.

In a possible implementation, the boost circuit includes an inductor, a diode, a third switch, and a capacitor. A first end of the inductor is connected to the third end of the switch circuit, a second end of the inductor is connected to a first end of the third switch and an anode of the diode, a cathode of the diode is connected to the output end of the boost circuit and a first end of the capacitor, and a second end of the third switch and a second end of the capacitor are grounded.

In a possible implementation, the controller is further configured to control, after controlling the first end of the switch circuit to be in communication with the third end of the switch circuit, the third switch in the boost circuit to enable the output voltage of the boost circuit to be greater than or equal to the preset voltage.

In a possible implementation, the controller is further configured to determine, in a case that an electric quantity of the battery is greater than or equal to a preset electric quantity, that the output voltage of the battery is greater than or equal to the preset voltage; and determine, in a case that the electric quantity of the battery is less than the preset electric quantity, that the output voltage of the battery is less than the preset voltage.

In a possible implementation, the electronic device further includes a temperature sensor. The controller is further configured to control, in a case that a temperature detection value of the temperature sensor is lower than a preset threshold, the first end of the switch circuit to be in communication with the third end of the switch circuit.

According to a second aspect, this application further provides a power supply method for a Smart PA, applied to the electronic device provided in the foregoing implementations. The method includes:

controlling, in a case that an output voltage of a battery is greater than or equal to a preset voltage, a first end of a switch circuit to be in communication with a second end of the switch circuit, where the preset voltage is greater than a minimum working voltage of a Smart PA; and controlling, in a case that the output voltage of the battery is less than the preset voltage, the first end of the switch circuit to be in communication with a third end of the switch circuit.

By using the method, when an output voltage of a battery is greater than or equal to a preset voltage, the battery directly supplies power to a Smart PA; and when the output voltage of the battery is less than the preset voltage, a boost circuit first boosts the output voltage of the battery, and then supplies power to the Smart PA by using the boosted voltage, to ensure that a voltage at an input end of the Smart PA is always greater than or equal to the preset voltage, that is, always greater than a minimum voltage required by the Smart PA to maintain normal working, to prevent the Smart PA from being triggered to stop working due to an insufficient input voltage. Therefore, a case such as noise or interruption can be prevented from occurring in an audio play back scenario when an electric quantity of the battery is low or an electronic device is in a low-temperature environment, thereby improving listening experience of a user.

In a possible implementation, in a case that an output volume of a speaker is a maximum volume, a divided voltage on a transmission line between the Smart PA and the battery is a first voltage, and the preset voltage is greater than or equal to a sum of the minimum working voltage of the Smart PA and the first voltage.

In a possible implementation, the method further includes:

determining the preset voltage according to an output volume of the speaker, where the preset voltage is in a positive correlation with the output volume of the speaker.

DESCRIPTION OF EMBODIMENTS

To enable those skilled in the art to understand the solutions of this application more clearly, application scenarios of the technical solutions of this application are first described below.

Figure 1:
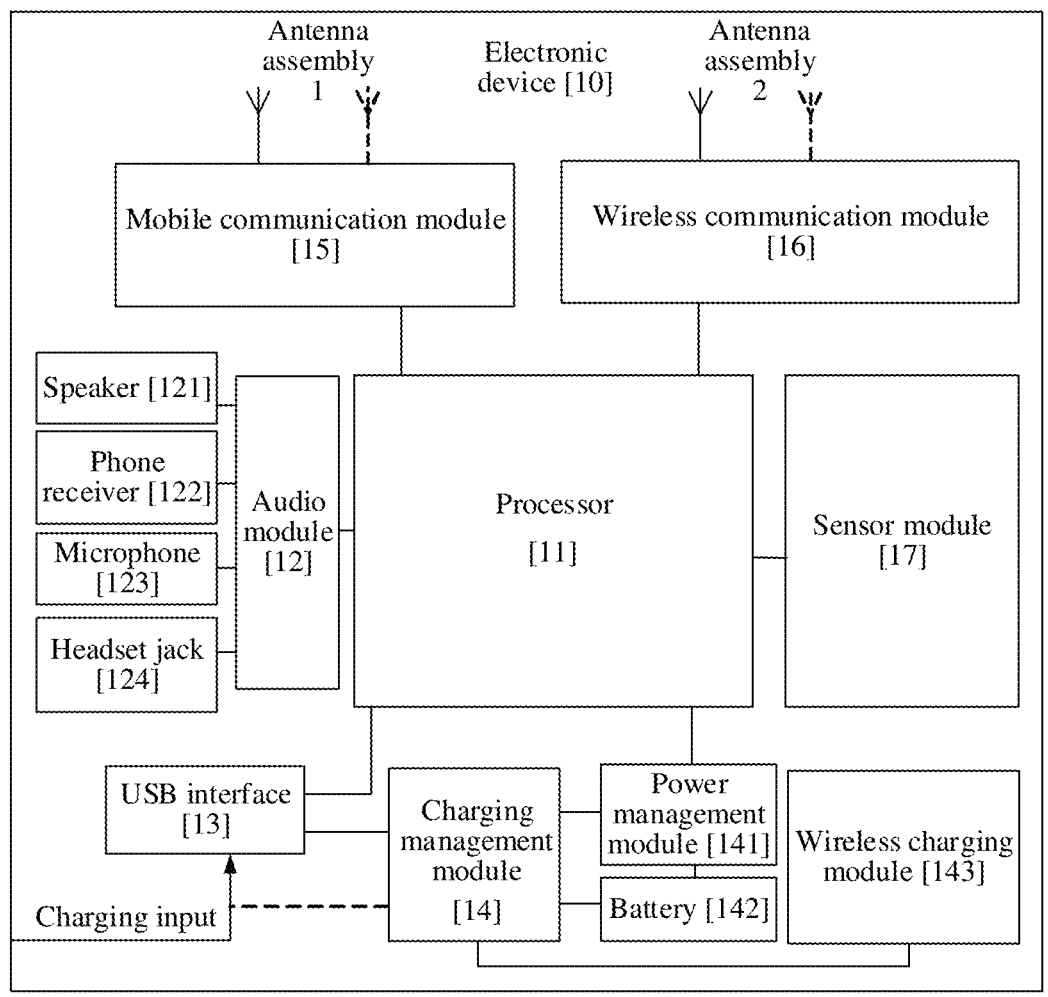
FIG. 1 is a schematic diagram of an electronic device.

FIG. 1 is a schematic diagram of an electronic device.

This embodiment of this application does not specifically limit a type of electronic device, and the electronic device may be a mobile phone, a notebook computer, a wearable electronic device (such as a smart watch), a tablet computer, an augmented reality (augmented reality, AR) device, a virtual reality (virtual reality, VR) device, an in-vehicle device, or the like.

An electronic device 10 may include a processor 11, an audio module 12, a speaker 121, a phone receiver 122, a microphone 123, a headset jack 124, a universal serial bus (universal serial bus, USB) interface 13, a charging management module 14, a power management module 141, a battery 142, a wireless charging module 143, an antenna assembly 1, an antenna assembly 2, a mobile communication module 15, a wireless communication module 16, a sensor module 17, and the like.

It may be understood that the structure shown in FIG. 1 does not constitute a specific limitation on the electronic device 10. The electronic device 10 may include more or fewer components than those shown in the figure, or some components may be combined, or some components may be split, or a different component deployment may be used. The components shown in the figure may be implemented by hardware, software, or a combination of software and hardware.

The processor 11 may include one or more processing units. For example, the processor 11 may include an application processor (application processor, AP), a modem processor, a graphics processing unit (graphics processing unit, GPU), an image signal processor (image signal processor, ISP), a controller, a video codec, a digital signal processor (digital signal processor, DSP), a baseband processor, a neural-network processing unit (neural-network processing unit, NPU), and/or the like. Different processing units may be independent devices, or may be integrated into one or more processors. The controller may generate an operation control signal according to instruction operation code and a time-sequence signal, to implement control of fetching an instruction and executing the instruction.

The processor 110 may be further configured with a memory, to store an instruction and data. In some embodiments, the memory in the processor 110 is a cache memory. The memory may store an instruction or data that is just used or used cyclically by the processor 110. If the processor 110 needs to use the instruction or the data again, the processor 110 may directly invoke the instruction or the data from the memory, which avoids repeated access, and reduces a waiting time of the processor 110, thereby improving system efficiency.

The USB interface 13 is an interface that complies with the USB standard specification, and may be specifically a Mini USB interface, a Micro USB interface, a USB Type C interface, or the like. The USB interface 13 may be configured to be connected to a charger to charge the electronic device 10, or may be used for data transmission between the electronic device 10 and a peripheral device, or may be configured to be connected to a headset, to play audio by using the headset. The interface may alternatively be configured to be connected to another electronic device such as an AR device.

It may be understood that an interface connection relationship between the modules illustrated in this embodiment of the present invention is merely an example for description, and does not constitute a limitation on a structure of the electronic device 10. In some other embodiments of this application, the electronic device 10 may alternatively use an interface connection manner different from that in the foregoing embodiment, or use a combination of a plurality of interface connection manners.

The charging management module 14 is configured to receive charging input from a charger. The charger may be a wireless charger, or may be a wired charger. In some embodiments of wired charging, the charging management module 14 may receive charging input of the wired charger through the USB interface 13. In some embodiments of wireless charging, the charging management module 14 may receive wireless charging input through a wireless charging coil of the wireless charging module 143. The charging management module 14 may further supply power to the electronic device by using the power management module 141 while charging the battery 142. In some other embodiments, the electronic device may perform wireless charging on another electronic device. That is, the wireless charging coil of the electronic device can convert an alternating current into an alternating current field, and when a wireless charging coil of the another electronic device approaches, the wireless charging coil of the another electronic device converts the alternating magnetic field into an alternating current, and then converts the alternating current into a direct current to charge a battery of the another electronic device.

The power management module 141 is configured to be connected to the battery 142, the charging management module 14, and the processor 11. The power management module 141 receives input of the battery 142 and/or the charging management module 14, to supply power to the processor 11, the mobile communication module 15, the wireless communication module 16, and the like. The power management module 141 may be further configured to monitor parameters such as a battery capacity, a battery cycle count, and a battery state of health (electric leakage and impedance). In some other embodiments, the power management module 141 may alternatively be disposed in the processor 11. In some other embodiments, the power management module 141 and the charging management module 14 may alternatively be disposed in a same device.

The audio module 12 is configured to convert digital audio information into analog audio signal output, and is also configured to convert analog audio input into a digital audio signal. The audio module 12 may be further configured to encode and decode an audio signal. In some embodiments, the audio module 12 may be disposed in the processor 11, or some functional modules of the audio module 12 are disposed in the processor 11. A Smart PA configured to supply power to the speaker 12 may be integrated in the audio module 12, or be independently disposed. This is not specifically limited in this application.

The speaker 121, also referred to as a "horn", is configured to convert an audio electrical signal into a sound signal. The electronic device 10 may implement an audio playback function by using the speaker 121. A specific quantity of speakers 121 disposed on the electronic device 10 is not limited in this embodiment of this application. In some embodiments, a plurality of speakers 121 may be disposed on the electronic device 10, so that audio playback can have a stereo effect, thereby improving user experience.

The phone receiver 122, also referred to as a "receiver", is configured to convert an audio electrical signal into a sound signal. When the electronic device 10 is configured to answer a call or receive voice information, the phone receiver 122 may be put close to a human ear to receive a voice.

The microphone 123, also referred to as a "voice tube" or a "mike", is configured to convert a sound signal into an electrical signal. When making a call or sending voice information, a user can make a sound near the microphone 123 through the mouth of the user to input a sound signal to the microphone 123. At least one microphone 123 may be disposed in the electronic device 10.

In some other embodiments, two microphones 123 may be disposed in the electronic device 10, to acquire a sound signal and implement a noise reduction function. In some other embodiments, three, four, or more microphones 123 may be alternatively disposed in the electronic device 10, to acquire a sound signal, implement noise reduction, recognize a sound source, implement a directional recording function, and the like.

The headset jack 124 is configured to be connected to a wired headset. The headset jack 124 may be the USB interface 13, or may be a 3.5 mm open mobile terminal platform (open mobile terminal platform, OMTP) standard interface or cellular telecommunications industry association of the USA (cellular telecommunications industry association of the USA, CTIA) standard interface.

Description is made below by using an example in which the electronic device is specifically a mobile phone device.

Figure 2:
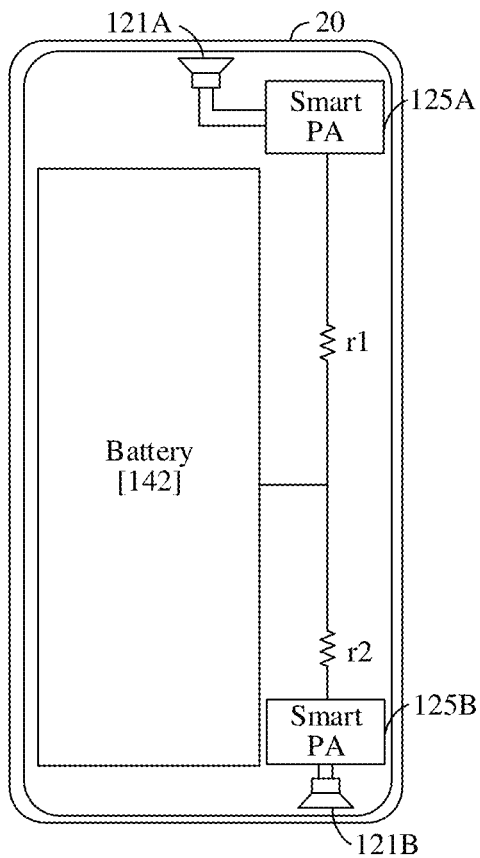
FIG. 2 is a schematic diagram of a mobile phone device.

FIG. 2 is a schematic diagram of a mobile phone device.

In FIG. 2, an example in which a mobile phone device 20 includes two speakers is used for description. In actual applications, one speaker or more speakers may alternatively be disposed in the mobile phone device 20. Details are not described herein again. Smart PAs 125A and 125B are powered by a battery 142 of an electronic device 20. In FIG. 2, an example in which the mobile phone device is powered by one battery is used. For a mobile phone device powered by a plurality of batteries, such as a mobile phone device with a folding screen, Smart PAs may be powered by a same battery, or powered by different batteries.

An output end of the Smart PA 125A is connected to a speaker 121A, and an output end of the Smart PA 125B is connected to a speaker 121B.

A Smart PA is also a power amplifier in essence, and further has a feedback function compared with an ordinary power amplifier. The Smart PA can specifically improve a dynamic range of sound output, dynamically track a state of a speaker and sense changes in an environment in which the speaker is located, and give changes after adaptation. In a possible implementation, a characteristic change of the speaker is related to a frequency/impedance curve, and the Smart PA can measure a voltage and current that are outputted in real time, to calculate the frequency/impedance curve of the speaker. The Smart PA can calculate current amplitude of a horn of the speaker according to a pre-established algorithm and a preset algorithm parameter, and can also predict future amplitude of the horn through calculation for an input signal. In this way, performance of the speaker can be effectively adjusted, for example, a volume increases, and sound quality is improved.

When the Smart PA works, a voltage at an input end needs to be greater than or equal to a minimum working voltage of the Smart PA; otherwise the Smart PA is triggered to stop working.

When the electronic device performs playback, if a playback volume suddenly increases or a playback sound resource is in a high-pitched stage, in this case, output power required by the speaker increases instantaneously. In other words, instantaneous power that needs to be outputted by the Smart PA increases. To drive the Smart PA to work, a current that needs to be outputted by the battery also increases instantaneously.

If an electric quantity of the battery 142 is low in this case, or when the electronic device 20 is in a cold environment, an output voltage of the battery 142 is low, and it may occur that the output voltage of the battery 142 is near the minimum working voltage of the Smart PA and is slightly greater than the minimum working voltage of the Smart PA. Because impedance between the battery 142 and a voltage input end of the Smart PA is difficult to constrain and the impedance corresponds to r1 and r2 in the figure, when the current that needs to be outputted by the battery 142 increases, instantaneous divided voltages on r1 and r2 increase, causing a voltage connected to the voltage input end of the Smart PA to drop. If the voltage at the voltage input end of the Smart PA drops below the minimum working voltage, the Smart PA is triggered to stop working. As a result, the speaker cannot continue to work normally. After the divided voltages on r1 and r2 reduce, the voltage at the voltage input end of the Smart PA is restored to above the minimum working voltage, and the Smart PA is enabled to continue to work. The foregoing working process leads to obvious noise and playback interruption in a playback scenario, which reduces use experience of a user.

To resolve the foregoing technical problems, this application provides an electronic device and a power supply method for a smart power amplifier. When an electric quantity of a battery is low or an electronic device is in a low-temperature environment, a Boost circuit on the electronic device can be used to improve an input voltage of a Smart PA, to ensure that the input voltage of the Smart PA is greater than a minimum working voltage of the Smart PA, so that noise can be prevented from occurring in an audio playback scenario when the electric quantity of the battery is low.

In addition, in this application, position terms such as "upper" and "lower" may include, but not limited to a position being defined relative to an illustrative position of a component in the accompanying drawings. It should be understood that these direction terms are relative concepts and are used for relative description and clarification, and may vary accordingly depending on a position change of a component in the accompanying drawings.

In the specification of this application, terms such as "first" and "second" are used merely for the purpose of description, and shall not be construed as indicating or implying relative importance or implying a quantity of indicated technical features.

In this application, unless otherwise explicitly specified or defined, the term "connection" should be understood in a broad sense. For example, the "connection" may be a fixed connection, a detachable connection, or an integral connection; or the "connection" may be a direct connection, or an indirect connection through an intermediary.

In embodiments of this application, the term such as "exemplarily" or "for example", is used to represent giving an example, an illustration or a description. Any embodiment or design scheme described by using "exemplarily" or "for example" in the embodiments of this application should not be explained as being more preferred or having more advantages than another embodiment or design scheme.

For ease of description, in the following embodiments, power supply for one Smart PA in the electronic device is used as an example for description. When the electronic device includes a plurality of Smart PAs, an implementation is similar. Details are not described herein again.

Figure 3:
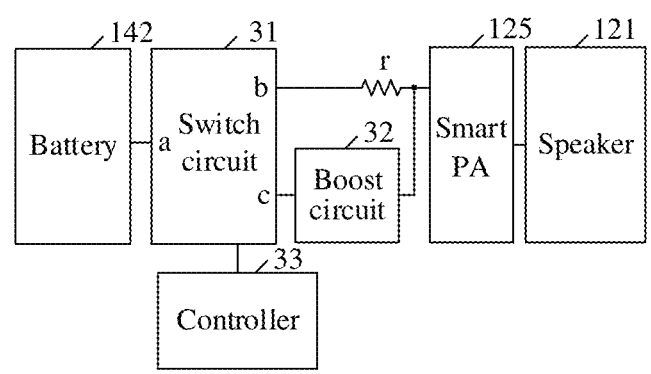
FIG. 3 is a schematic diagram of an electronic device according to an embodiment of this application.

FIG. 3 is a schematic diagram of an electronic device according to an embodiment of this application.

The electronic device shown in the figure includes a battery 142, a switch circuit 31, a boost (Boost) circuit 32, a Smart PA 125, a speaker 121, and a controller 33.

The battery 142 is connected to a first end a of the switch circuit 31, a second end b of the switch circuit 31 is connected to an input end of the Smart PA 125, and line impedance between the switch circuit 31 and the input end of the Smart PA 125 is r.

A third end c of the switch circuit 31 is connected to the input end of the Smart PA 125 through the Boost circuit 32.

The Smart PA 125 is configured to drive the speaker 121 to perform audio playback.

When the Smart PA 125 works, a voltage at the input end needs to be greater than or equal to a minimum working voltage of the Smart PA 125; otherwise the Smart PA 125 stops working. In other words, the minimum working voltage is a minimum voltage required by the Smart PA 125 to maintain normal working.

In this embodiment of this application, a preset voltage is pre-determined as a trigger reference of a working state of the switch circuit 31, and the preset voltage is greater than the minimum working voltage required by the Smart PA 125 to maintain normal working.

The controller 33 controls, when an output voltage of the battery 142 is greater than or equal to the preset voltage, the first end a of the switch circuit 31 to be in communication with the second end b of the switch circuit 31. In this case, the Boost circuit 32 does not access a circuit, to enable the battery 142 to directly supply power to the Smart PA 125. The controller 33 controls, when the output voltage of the battery 142 is less than the preset voltage, the first end a of the switch circuit 31 to be in communication with the third end c of the switch circuit 31. In this case, the Boost circuit 32 accesses a circuit, and the Boost circuit boosts the output voltage of the battery 142 and then transmits the boosted voltage to the input end of the Smart PA 125.

The preset voltage is not limited in this embodiment of this application. In some embodiments, the preset voltage may be set to be slightly greater than the minimum working voltage of the Smart PA 125. Description is made below with reference to an example.

For example, in some embodiments, the output voltage of the battery 142 after being fully charged is 4.2 V, and a discharge cut-off voltage of the battery 142 is 2.8 V, that is, a range of the output voltage of the battery 142 is from 2.8 V to 4.2 V, and the minimum voltage required by the Smart PA 125 to maintain normal working. In this case, the preset voltage may be set to 3 V. When a current output voltage of the battery 142 is greater than or equal to 3 V, it represents that, in this case, an electric quantity of the battery 142 is sufficient, or a temperature of an environment in which the electronic device is located has little influence on the output voltage of the battery. In this case, the controller 33 controls the first end a and the second end b of the switch circuit 31 to be in communication, and the output voltage of the battery 142 is sufficient to enable the Smart PA 125 to maintain the minimum voltage required by the Smart PA 125 to work normally.

When the current output voltage of the battery 142 is less than 3 V, it represents that, in this case, the electric quantity of the battery 142 is low, or the temperature of the environment in which the electronic device is located is low, affecting the output voltage of the battery 142. In this case, the output voltage of the battery 142 may be insufficient to directly maintain normal working of the Smart PA 125. If the output voltage of the battery 142 is continuously and directly transmitted to the input end of the Smart PA 125, when a playback volume suddenly increases or a playback sound resource is in a high-pitched stage, instantaneous output power that needs to be outputted by the Smart PA 125 increases, a current that needs to be outputted by the battery also increases instantaneously, an instantaneous divided voltage on the impedance r increases, which may cause a voltage connected to a voltage input end of the Smart PA 125 to drop below the minimum working voltage, and cause the Smart PA to be triggered to stop working. Therefore, in the solution of this application, the controller 33 controls the first end a and the third end c of the switch circuit 31 to be in communication, and in this case, the output voltage of the battery 142 is first boosted by the Boost circuit 32 and then supplies power to the Smart PA 125.

In some embodiments, the output voltage boosted by the Boost circuit 32 is greater than or equal to the preset voltage.

In summary, in the solution provided in this embodiment of this application, when an output voltage of a battery is greater than or equal to a preset voltage, the battery directly supplies power to a Smart PA; and when the output voltage of the battery is less than the preset voltage, a Boost circuit first boosts the output voltage of the battery, and then supplies power to the Smart PA by using the boosted voltage, to ensure that a voltage at an input end of the Smart PA is always greater than or equal to the preset voltage, that is, always greater than a minimum voltage required by the Smart PA to maintain normal working, to prevent the Smart PA from being triggered to stop working due to an insufficient input voltage. Therefore, in the solution of this application, a case such as noise or interruption can be prevented from occurring in an audio playback scenario when an electric quantity of the battery is low or an electronic device is in a low-temperature environment, thereby improving listening experience of a user.

Description is made below with reference to specific implementations.

Figure 4:
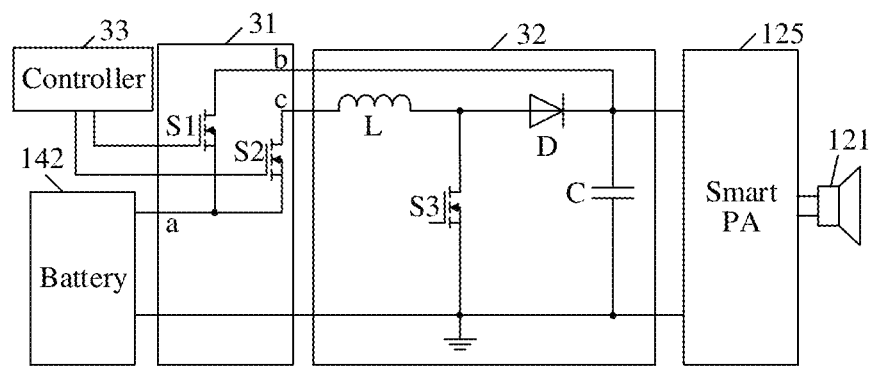
FIG. 4 is a schematic diagram of another electronic device according to an embodiment of this application.

FIG. 4 is a schematic diagram of another electronic device according to an embodiment of this application.

A switch circuit 31 of the electronic device shown in the figure includes a first switch S1 and a second switch S2.

A Boost circuit 32 includes a third switch S3, an inductor L, a diode D, and a capacitor C.

The first switch S1, the second switch S2, and the third switch S3 may be any one of the following types: an insulated gate bipolar transistor (Insulated Gate Bipolar Transistor, IGBT) or a metal oxide semiconductor field effect transistor (Metal Oxide Semiconductor Filed Effect Transistor, MOSFET, hereinafter referred to as a MOS transistor), a silicon carbide field effect transistor (Silicon Carbide Metal Oxide Semiconductor, SiC MOSFET), or the like. In the following description, an example in which the first switch S1, the second switch S2, and the third switch S3 are all MOS transistors is used. When a switch is a MOS transistor, a first end of the switch is a drain, a second end of the switch is a source, and a control end of the switch is a gate. A controller 33 sends a control signal to the switch through a connection to the gate of the switch, and then switches an on-off state of the switch. In a typical implementation, the control signal is a level signal, and the switch is an NMOS transistor. When the control end of the switch is connected to a high level, the switch is on; and when the control end of the switch is connected to a low level, the switch is off.

A first end of S1 is connected to a second end b of the switch circuit 31, a first end of S2 is connected to a third end c of the switch circuit 31, and second ends of S1 and S2 are connected to a first end a of the switch circuit 31. Control ends of S1 and S2 are connected to the controller 33, to obtain a control signal.

The controller 33 may be an application-specific integrated circuit (Application-Specific Integrated Circuit, ASIC), a programmable logic device (Programmable Logic Device, PLD), a digital signal processor (Digital Signal Processor, DSP), or a combination thereof. The PLD may be a complex programmable logic device (Complex Programmable Logic Device, CPLD), a field-programmable gate array (Field-programmable Gate Array, FPGA), a generic array logic (Generic Array Logic, GAL), or any combination thereof. This is not specifically limited in this embodiment of this application. The controller 33 may be independently disposed, or may be integrated in a processor of the electronic device. This is not specifically limited in this embodiment of this application.

A first end of the inductor L is connected to the third end c of the switch circuit 31, and a second end of the inductor L is connected to a first end of the third switch S3 and an anode of the diode D; a second end of the third switch S3 is grounded; and a cathode of the diode D is connected to an output end of the Boost circuit and a first end of the capacitor C, and a second end of the capacitor C is grounded.

The controller 33 may obtain an output voltage of a battery 142 in real time. In some embodiments, the controller 33 can sample the output voltage of the battery 142, to obtain the output voltage of the battery 142. In some other embodiments, a power management module on the electronic device 142 obtains the output voltage of the battery 142, and sends a signal for indicating the output voltage of the battery 142 to the controller 33, so that the controller 33 obtains the output voltage of the battery 142.

When the output voltage of the battery 142 is greater than or equal to a preset voltage, it represents that, in this case, an electric quantity of the battery is high or the battery does not work in a cold environment. In this case, the controller 33 controls the first switch S1 to be on, and the second switch S2 to be off, to enable the first end a and the second end b of the switch circuit to be in communication. In this case, an output end of the battery 142 is connected to a voltage input end of a Smart PA, and the Boost circuit does not work.

When the output voltage of the battery 142 is less than the preset voltage, it represents that, in this case, the electric quantity of the battery 142 is low or the battery works in a cold environment, causing a low output voltage. In this case, the controller 33 controls the first switch S1 to be off, and the second switch S2 to be on, to enable the first end a and the third end c of the switch circuit 31 to be in communication. In this case, after being boosted by the Boost circuit 32, the output voltage of the battery 142 is connected to the voltage input end of the Smart PA, to ensure that a voltage connected to the voltage input end of the Smart PA is always greater than or equal to the preset voltage.

The following specifically describes a working principle of the Boost circuit 32.

When the Boost circuit 32 accesses a circuit to boost. S3 is first on, and an input voltage passes through the inductor L. The diode D prevents the capacitor C from discharging to ground. Because a direct current is inputted, a current on the inductor L increases linearly at a rate, and the rate is related to an inductance value of the inductor L. As the current on the inductor increases, some energy is stored in the inductor L. and then S3 is controlled to be off. Due to a current retention characteristic of the inductor L, the current flowing through the inductor L does not immediately change to 0 but slowly changes from a value when the charging is completed to 0. Because the original circuit has been off, the inductor L can only discharge through a new circuit, that is, the inductor starts to charge the capacitor, and voltages at two ends of the capacitor increase. In this case, the voltages are already higher than the input voltage.

In some embodiments, S3 may be controlled by the controller 33. In some other embodiments, S3 may be controlled by another independent controller corresponding to the Boost circuit 32. This is not specifically limited in this embodiment of this application.

A manner for setting a value of the preset voltage is described below with reference to an actual application scenario.

An output end of the Smart PA 125 in this embodiment of this application is connected to a speaker 121, to drive the speaker 121 to implement playback. Output power of the Smart PA 125 is related to output power of the speaker 121.

When a volume that needs to be outputted by the speaker 121 is high, instantaneous power of the speaker 121 is large. Therefore, instantaneous output power of the Smart PA 125 also increases, and in this case, a current that needs to be outputted by the battery 142 also increases instantaneously. When the volume that needs to be outputted by the speaker 121 is low; the instantaneous power of the speaker 121 is small. Therefore, the instantaneous output power of the Smart PA 125 also reduces, and in this case, the current that needs to be outputted by the battery 142 also reduces instantaneously. A divided voltage of line impedance at the input end of the Smart PA is in a positive correlation with a current. Therefore, the divided voltage of the line impedance is also in a positive correlation with the instantaneous power of the speaker 121. In other words, when the speaker 121 outputs a minimum volume, the divided voltage of the line impedance is V1; and when the speaker 121 outputs a maximum volume, the divided voltage of the line impedance is V2, where V2 is greater than V1.

A minimum working voltage required by the Smart PA to maintain normal working is V0. When the speaker 121 outputs the minimum volume, a minimum voltage that needs to be outputted by the battery 142 is V0+V1, to maintain normal working of the Smart PA 125; and when the speaker 121 outputs the maximum volume, the minimum voltage that needs to be outputted by the battery 142 is V0+V2, to maintain normal working of the Smart PA 125. In other words, the preset voltage may be set to V0+V2. When the output voltage of the battery 142 is greater than or equal to V0+V2, in this case, it may be ensured that the Smart PA 125 works normally.

When the electric quantity of the battery 142 is insufficient and causes the output voltage to drop or when the electronic device is in a cold environment, the output voltage of the battery 142 is less than V0+V2. In this case, the first end a and the third end c of the switch circuit are in communication, so that the Boost circuit 32 accesses the circuit and boosts the output voltage of the battery 142. In this way, an output voltage of the Boost circuit 32 is greater than or equal to V0+V2, to ensure that the Smart PA 125 works normally.

The minimum working voltage V0 required by the Smart PA to maintain normal working is a device parameter of the Smart PA, and may be pre-determined. V2 may be calibrated by testing the electronic device, that is, the preset voltage V0+V2 is determined.

In some embodiments, the determined preset voltage V0+V2 is stored in a register or a memory to be invoked during use.

The foregoing is only one possible manner for determining the preset voltage. In actual applications, in some embodiments, to ensure that the Smart PA works normally, the preset voltage may further increase.

In some other embodiments, a correspondence between the preset voltage and an audio playback volume is pre-calibrated and stored, that is, the preset voltage may change. After the volume is determined, the corresponding preset voltage is determined. The controller controls the switch circuit according to the determined preset voltage.

The preset voltage is in a positive correlation with the audio playback volume. That is, a larger playback volume indicates a larger preset voltage, and that the playback volume reduces indicates that the corresponding preset voltage also reduces. The preset voltage of this manner is adjustable. Therefore, a time for which the Boost circuit 32 accesses the circuit can be reduced, thereby prolonging an endurance time of the battery 142.

Figure 5:
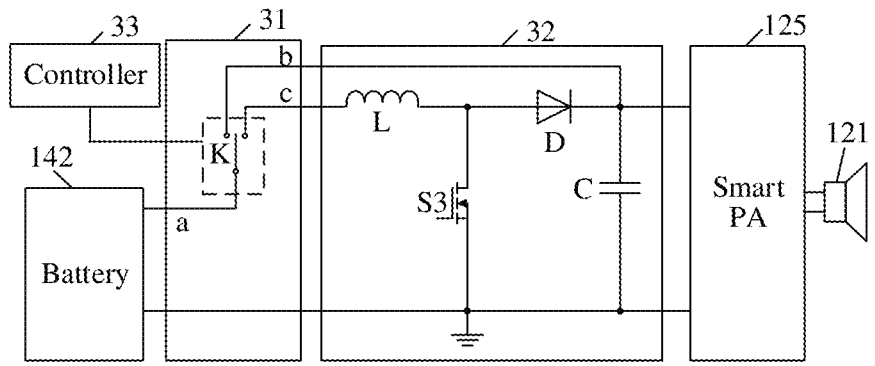
FIG. 5 is a schematic diagram of still another electronic device according to an embodiment of this application.

FIG. 5 is a schematic diagram of still another electronic device according to an embodiment of this application.

A difference between the electronic device shown in FIG. 5 and the electronic device shown in FIG. 4 lies in that, the switch circuit 31 includes a single pole double throw (single pole double throw; SPDT) switch K.

A movable end of K is connected to the first end a of the switch circuit 31, that is, connected to the output voltage of the battery 142. A first non-movable end of K is connected to the second end b of the switch circuit 31, and a second non-movable end of K is connected to the third end c of the switch circuit 31.

The controller 33 controls, when the output voltage of the battery 142 is greater than or equal to the preset voltage, the movable end and the first non-movable end of K to be in communication, to enable the first end a and the second end b of the switch circuit 31 to be in communication. The controller 33 controls, when the output voltage of the battery 142 is less than the preset voltage, the movable end and the second non-movable end of K to be in communication, to enable the first end a and the third end c of the switch circuit to be in communication, and the Boost circuit 32 to access the circuit.

For a working principle of the Boost circuit 32 in FIG. 5, refer to the foregoing description. Details are not described herein again.

In the foregoing description, power supply for one Smart PA in the electronic device is used as an example. Description is made below by using an example in which the electronic device is specifically a mobile phone device.

Figure 6:
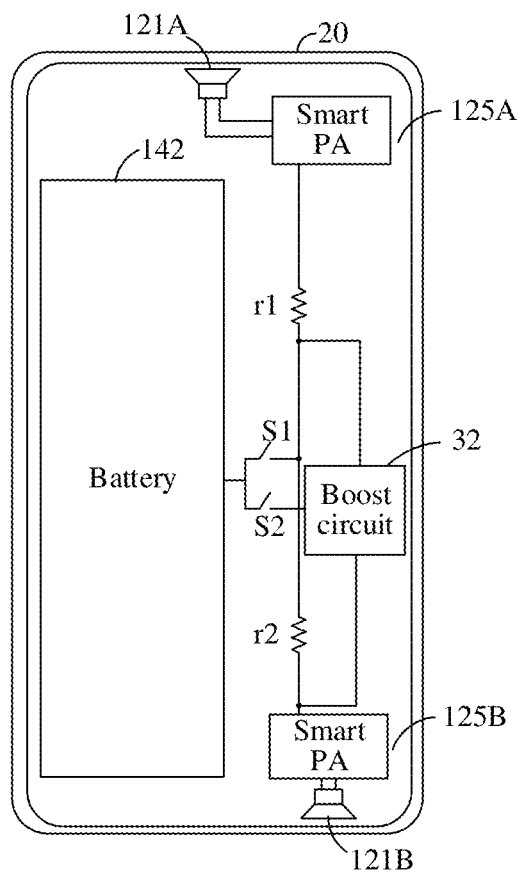
FIG. 6 is a schematic diagram of a mobile phone device according to an embodiment of this application.

FIG. 6 is a schematic diagram of a mobile phone device according to an embodiment of this application.

A mobile phone device 20 includes two speakers: a speaker 121A and a speaker 121B respectively. The speaker 121A is driven by a Smart PA 125A, and the speaker 121B is driven by a Smart PA 125B. The Smart PA 125A and the Smart PA 125B are powered by a battery 142 of an electronic device 20.

In this case, when an output voltage of the battery 142 is greater than or equal to a preset voltage, a controller controls S1 to be on, and S2 to be off, to enable the battery 142 to directly supply power to the Smart PA 125A and the Smart PA 125B. By configuring the preset voltage reasonably, the Smart PA 125A and the Smart PA 125B can always maintain normal working when the mobile phone device is in a playback scenario. When the output voltage of the battery 142 is less than the preset voltage, the controller controls S2 to be on, and S1 to be off, to enable a Boost circuit 32 to access a circuit. By boosting the output voltage of the battery 142, an output voltage of the Boost circuit 32 is greater than or equal to the preset voltage, so that the Smart PA 125A and the Smart PA 125B always maintain normal working.

It may be understood that, in actual applications, when a temperature significantly decreases or an electric quantity reduces, the output voltage of the battery 142 reduces. In other words, when the controller controls a working state of a switch circuit according to a parameter, that is, the output voltage of the battery 142, influence of the electric quantity and the temperature on the output voltage has also been already taken into account.

In some other embodiments, the controller controls, when a temperature detection value of a temperature sensor is lower than a preset threshold, a first end of the switch circuit to be in communication with a third end of the switch circuit, to ensure that a Smart PA can work normally in a low-temperature environment. The control logic of the controller may independently exist, or may coexist with the foregoing control logic based on the output voltage of the battery. This is not specifically limited in this embodiment of this application.

In the example in FIG. 6, an example in which input voltages of the two Smart PAS are both boosted by one Boost circuit is used. In actual applications, two Boost circuits may alternatively be disposed, and each Boost circuit boosts an input voltage of a Smart PA respectively.

In summary, by using the solution provided in this embodiment of this application, when an output voltage of a battery is greater than or equal to a preset voltage, the battery directly supplies power to a Smart PA; and when the output voltage of the battery is less than the preset voltage, a Boost circuit first boosts the output voltage of the battery, and then supplies power to the Smart PA by using the boosted voltage, to ensure that a voltage at an input end of the Smart PA is always greater than or equal to the preset voltage, that is, always greater than a minimum voltage required by the Smart PA to maintain normal working, to prevent the Smart PA from being triggered to stop working due to an insufficient input voltage. Therefore, in the solution of this application, a case such as noise or interruption can be prevented from occurring in an audio playback scenario when an electric quantity of the battery is low or an electronic device is in a low-temperature environment, thereby improving listening experience of a user. Another implementation of the electronic device is described below.

Currently, with the development of wireless power supply technologies, some electronic devices, such as mobile phone devices, may support a reverse power supply function. An example in which the electronic device is a mobile phone device is used below for specific description.

Figure 7:
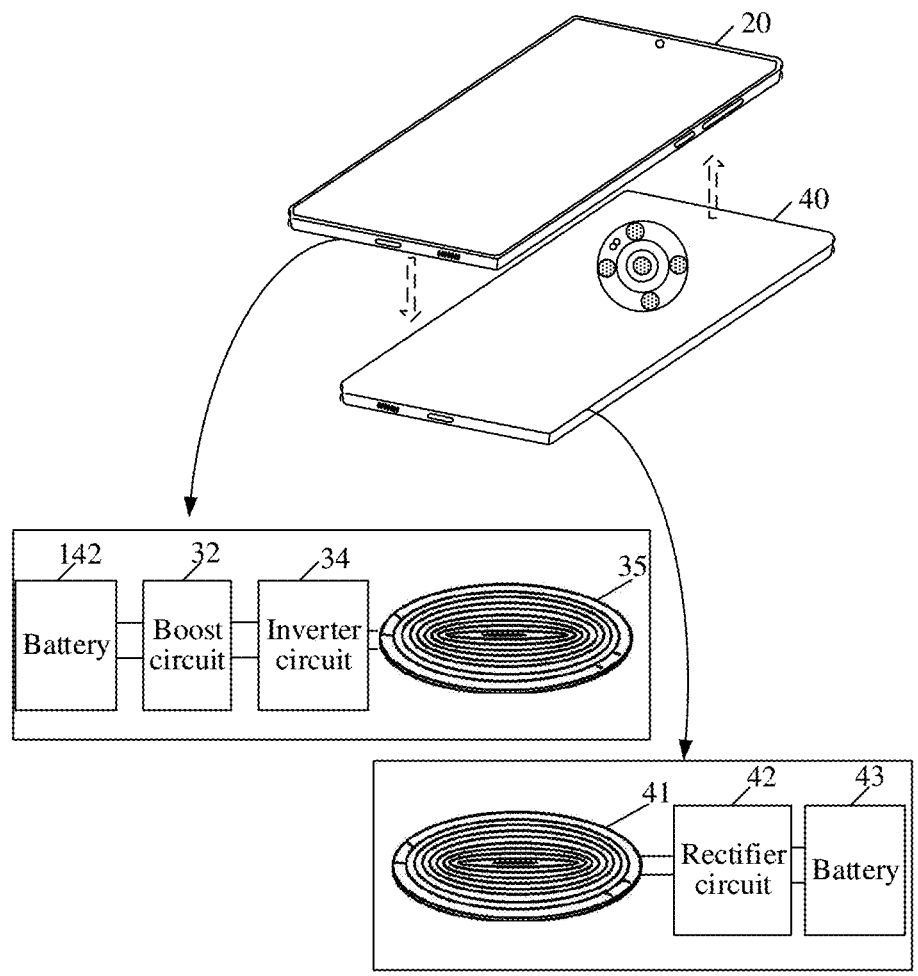
FIG. 7 is a schematic diagram in which a mobile phone device reversely supplies power according to an embodiment of this application.

FIG. 7 is a schematic diagram in which a mobile phone device reversely supplies power according to an embodiment of this application.

A mobile phone device 20 includes a battery 142, a Boost circuit 32, an inverter circuit 34, and a power transmit coil 35.

A mobile phone device 40 includes a power receive coil 41, a rectifier circuit 42, and a battery 43.

When the mobile phone device 20 starts a reverse power supply function, the mobile phone device 20 and the mobile phone device 40 are generally placed in back-to-back contact, the battery 142 of the mobile phone device 20 provides energy, a direct current outputted by the battery 142 is boosted by the Boost circuit 32 and then transmitted to the inverter circuit 34, the inverter circuit 34 converts the direct current into an alternating current and transmits the alternating current to the power transmit coil 35, and the power transmit coil 35 uses the alternating current to generate an alternating magnetic field to transmit energy to the outside.

The power receive coil 41 on the mobile phone device 40 may convert the alternating magnetic field into an alternating current, and the alternating current is transmitted to the rectifier circuit 42 and then converted into a direct current, thereby charging the battery 43 on the mobile phone device 40.

In a typical embodiment, an output voltage of the battery 142 of the mobile phone device 40 after being fully charged is 4.2 V, and a discharge cut-off voltage of the battery 142 is 2.8 V, that is, a range of the output voltage of the battery 142 is from 2.8 V to 4.2 V. When the mobile phone device 40 starts the reverse power supply function, the Boost circuit 32 generally boosts the output voltage of the battery 142 to 5 V, to improve charging efficiency of the battery 43 of the mobile phone device 40.

It may be understood that, examples of the foregoing voltage parameters are only for ease of description, and do not constitute a limitation on the technical solutions of this application. In actual applications, different voltage parameters may be provided when batteries and circuit elements are of different models.

An example in which the mobile phone device 20 charges another mobile phone device is used in the foregoing description. In actual applications, the mobile phone device 20 may alternatively perform wireless charging on devices such as a wearable electronic device (such as a smart watch and a smart headset).

According to the foregoing description, for an electronic device that supports reverse power supply, when implementing the technical solutions of this application, an original Boost circuit may be directly reused to boost, and there is no need to independently dispose another Boost circuit, thereby reducing hardware costs and space occupation. Description is made below in detail.

Figure 8:
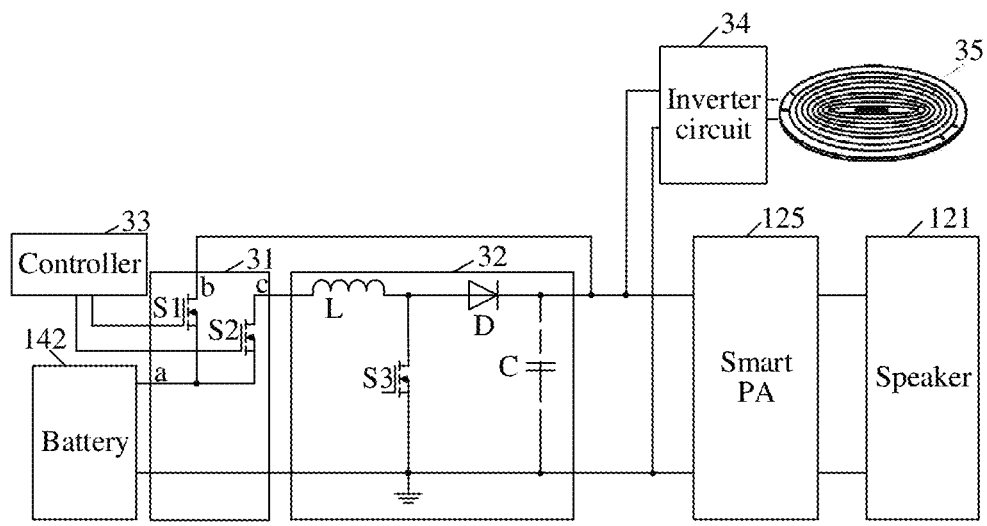
FIG. 8 is a schematic diagram of another electronic device according to an embodiment of this application.

FIG. 8 is a schematic diagram of another electronic device according to an embodiment of this application.

The electronic device shown in FIG. 8 supports a reverse power supply function. Referring to corresponding description in FIG. 7, in this case, a Boost circuit configured to boost an output voltage of a battery 142 is originally disposed in the electronic device.

In this embodiment of this application, actual application scenarios of the electronic device are analyzed, that is, when the electronic device reversely supplies power to another external device, a user generally does not use the electronic device to perform audio playback; and when the user uses the electronic device to perform audio playback, for example, play a video or music, the electronic device is not generally in a reverse power supply state. Therefore, the electronic device may perform time division duplexing on the Boost circuit, that is, may be used to resolve a problem of playback noise when the battery has a low temperature and a low electric quantity, and avoid an additional setting of the Boost circuit, thereby reducing space and hardware costs.

Further, in some embodiments, if the user still uses the electronic device to implement audio playback when using the electronic device to reversely supply power to another external device, in this case, to realize the reverse power supply function, as described in the description of the example corresponding to FIG. 7, an output voltage is generally 5 V after the Boost circuit 32 boosts the output voltage of the battery 142. In this case, in a possible implementation, if the 5 V voltage is greater than a preset voltage and is less than or equal to a maximum input voltage of a Smart PA 125, in this case, an output end of the Boost circuit 32 may be connected to an input end of the Smart PA 125 to maintain normal working of the Smart PA 125. In another possible implementation, if the 5 V voltage is greater than the preset voltage and is greater than the maximum input voltage of the Smart PA 125, a connection between the Boost circuit 32 and the input end of the Smart PA 125 needs to be off, to avoid damaging the Smart PA 125.

In some embodiments, the electronic device may be configured as that, when the electronic device starts the external reverse power supply function, a connection between the output end of the Boost circuit 32 and the input end of the Smart PA 125 is off, and only the battery 142 can supply power to the Smart PA 125. When the electronic device closes the reverse power supply function and the output voltage of the battery 142 is greater than or equal to the preset voltage, a controller 33 controls a first end a and a second end b of a switch circuit 31 to be in communication, to enable the battery 142 to supply power to the Smart PA 125. When the electronic device closes the reverse power supply function and the output voltage of the battery 142 is less than the preset voltage, the controller 33 controls the first end a and a third end c of the switch circuit 31 to be in communication, to enable the output voltage of the battery 142 to be boosted by the Boost circuit 32 and then supply power to the Smart PA 125.

In a possible implementation, the controller 33 may actively switch a first switch S1 and a second switch S2, to realize playback optimization when the battery has a low temperature and a low electric quantity, thereby ensuring that there is no noise in a playback process.

When this manner is implemented, the controller 33 automatically obtains the output voltage of the battery 142 in real time; controls, when the output voltage of the battery is greater than or equal to the preset voltage, the first switch S1 to be on, and the second switch S2 to be off; and controls, when the output voltage of the battery is less than the preset voltage, the first switch S1 to be off, and the second switch S2 to be on.

Specifically, the controller 33 determines, when an electric quantity of the battery is greater than or equal to a preset electric quantity, that the output voltage of the battery is greater than or equal to the preset voltage; and determines, when the electric quantity of the battery is less than the preset electric quantity, that the output voltage of the battery is less than the preset voltage. A correspondence between the preset electric quantity and the preset voltage may be pre-calibrated and stored.

In another possible implementation, when the Boost circuit 32 is used to boost an input voltage of the Smart PA 125, consumption of the electric quantity of the battery 142 is accelerated, and an endurance time of the battery of the electronic device is shortened to a certain extent. Therefore, to balance requirements of the user for the audio playback and the endurance time, the foregoing switching manners can only be enabled after being triggered by the user. In other words, the user may determine, according to the requirements, whether to actively configure a playback optimization function. An example in which the electronic device is a mobile phone device is used below for specific description.

The foregoing Boost circuit is only a possible implementation. In actual applications, another circuit implementation may alternatively be used to boost the output voltage of the battery, but a principle is similar to the foregoing description. This is not described in this embodiment of this application.

Figure 9:
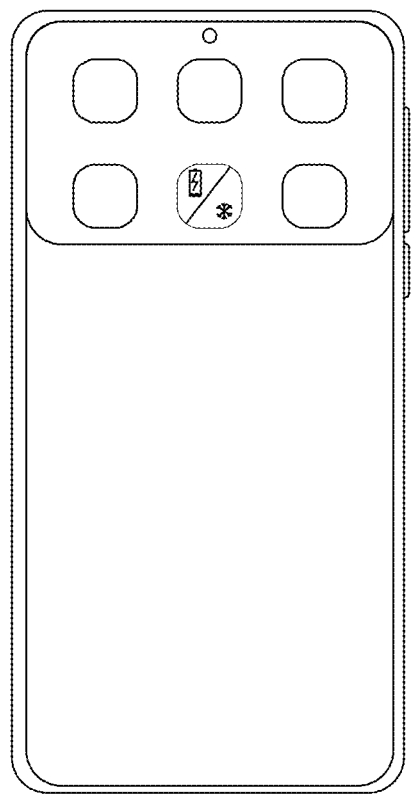
FIG. 9 is a first schematic diagram of a setting interface of a mobile phone device according to an embodiment of this application.
Figure 10:
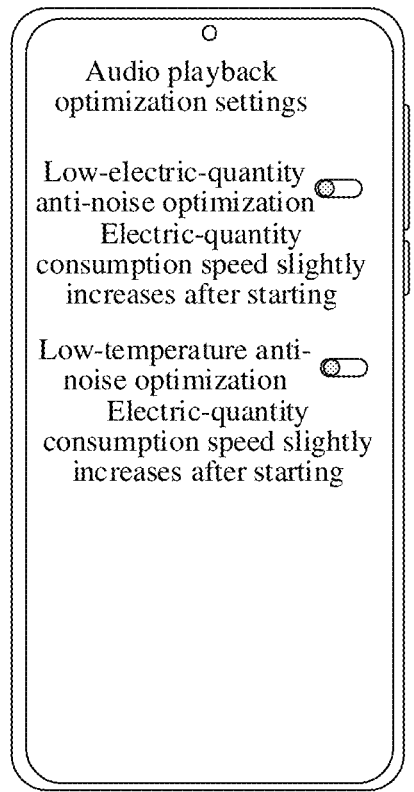
FIG. 10 is a second schematic diagram of a setting interface of a mobile phone device according to an embodiment of this application.

Referring to FIG. 9 and FIG. 10 together, FIG. 9 is a first schematic diagram of a setting interface of a mobile phone device according to an embodiment of this application, and FIG. 10 is a second schematic diagram of a setting interface of a mobile phone device according to an embodiment of this application.

A user may start a playback optimization function in a convenience menu shown in FIG. 9, or may start a playback optimization function in a setting menu shown in FIG. 10.

When the user does not start a playback audio optimization function, an electronic device directly uses a battery to supply power to a Smart PA by default.

When the user starts the playback audio optimization function, a controller of the electronic device may control a switch circuit in the manners described in the foregoing embodiments, to resolve a problem of playback noise when the battery has a low temperature and a low electric quantity.

The playback audio optimization function includes low-electric-quantity anti-noise optimization and low-temperature anti-noise optimization. When the low-electric-quantity anti-noise optimization is started, the controller controls the switch circuit according to an electric quantity or an output voltage of the battery. When the low-temperature anti-noise optimization is started, the controller may control the switch circuit according to a relationship between a temperature detection value of a temperature sensor and a preset threshold.

In a possible implementation, the electronic device may alternatively have an active notification function. That is, the temperature sensor of the electronic device detects a temperature in real time, and when a temperature detection result is lower than a preset temperature and the electronic device performs audio playback, the electronic device notifies the user and actively asks whether to start the playback audio optimization function; and when the electric quantity of the battery is lower than a preset electric quantity and the electronic device performs audio playback, the electronic device notifies the user and actively asks whether to start the playback audio optimization function.

In summary; through the solution provided in this embodiment, it can be determined whether to start an audio playback optimization function according to requirements of a user. After the function is started, a case such as noise or interruption can be prevented from occurring in an audio playback scenario when an electric quantity of a battery is low or an electronic device is in a low-temperature environment, thereby improving listening experience of the user. When the function is not started, a consumption speed of the electric quantity of the battery can be slowed down, and an endurance time of the device can be prolonged. In summary, the solution provided in this embodiment of this application can improve use experience of the user.

Based on the electronic device provided in the foregoing embodiments, an embodiment of this application further provides a power supply method for a Smart PA. Description is made below in detail with reference to the accompanying drawings.

Figure 11:
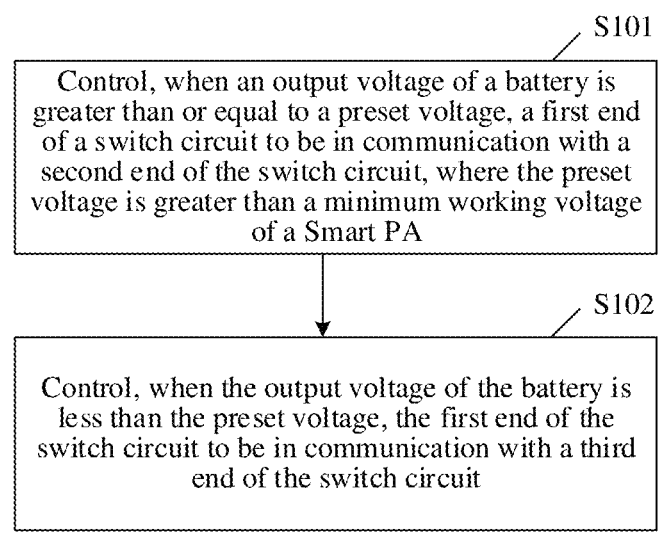
FIG. 11 is a flowchart of a power supply method for a Smart PA according to an embodiment of this application.

FIG. 11 is a flowchart of a power supply method for a Smart PA according to an embodiment of this application.

The method is applied to the electronic device described in the forgoing embodiments. For specific description of the electronic device, details are not described herein again. The method includes the following steps.

S101: Control, when an output voltage of a battery is greater than or equal to a preset voltage, a first end of a switch circuit to be in communication with a second end of the switch circuit, where the preset voltage is greater than a minimum working voltage of a Smart PA.

In a possible implementation, when an output volume of a speaker is maximum volume, a divided voltage on a transmission line between the Smart PA and the battery is a first voltage, and the preset voltage is greater than or equal to a sum of the minimum working voltage of the Smart PA and the first voltage. The minimum working voltage required by the Smart PA to maintain normal working is a device parameter of the Smart PA, and may be pre-determined. The first voltage may be calibrated by testing the electronic device.

In another possible implementation, a correspondence between the preset voltage and an audio playback volume is pre-calibrated and stored, that is, the preset voltage may change. After the volume is determined, the corresponding preset voltage is determined. The controller controls the switch circuit according to the determined preset voltage. The preset voltage is in a positive correlation with the audio playback volume. That is, a larger playback volume indicates a larger preset voltage, and that the playback volume reduces indicates that the corresponding preset voltage also reduces. The preset voltage of this manner is adjustable. Therefore, a time for which a boost circuit accesses a circuit can be reduced, thereby prolonging an endurance time of the battery.

S102: Control, when the output voltage of the battery is less than the preset voltage, the first end of the switch circuit to be in communication with a third end of the switch circuit.

In a possible implementation, the switch circuit includes a single pole double throw switch. A movable end of the single pole double throw switch is connected to the first end of the switch circuit, a first non-movable end of the single pole double throw switch is connected to the second end of the switch circuit, and a second non-movable end of the single pole double throw switch is connected to the third end of the switch circuit. When the output voltage of the battery is greater than or equal to the preset voltage, the movable end is controlled to be connected to the first non-movable end, to enable the first end of the switch circuit to be in communication with the second end of the switch circuit; and when the output voltage of the battery is less than the preset voltage, the movable end is controlled to be connected to the second non-movable end, to enable the first end of the switch circuit to be in communication with the third end of the switch circuit.

In another possible implementation, the switch circuit includes a first switch and a second switch.

A first end of the first switch is connected to the second end of the switch circuit, a second end of the first switch and a second end of the second switch are connected to the first end of the switch circuit, and a first end of the second switch is connected to the third end of the switch circuit. When the output voltage of the battery is greater than or equal to the preset voltage, the first switch is controlled to be on and the second switch is controlled to be off, to enable the first end of the switch circuit to be in communication with the second end of the switch circuit; and when the output voltage of the battery is less than the preset voltage, the first switch is controlled to be off and the second switch is controlled to be on, to enable the first end of the switch circuit to be in communication with the third end of the switch circuit.

In some possible implementations, the electronic device has a function of reversely supplying power to an external device. In this case, the electronic device may perform time division duplexing on the boost circuit, that is, may be used to resolve a problem of play back noise when the battery has a low temperature and a low electric quantity, and avoid an additional setting of the boost circuit, thereby reducing space and hardware costs.

In a possible implementation, after the first end of the switch circuit is controlled to be in communication with the third end of the switch circuit, a third switch in the boost circuit is controlled to enable an output voltage of the boost circuit to be greater than or equal to the preset voltage.

In a possible implementation, when an electric quantity of the battery is greater than or equal to a preset electric quantity, it is determined that the output voltage of the battery is greater than or equal to the preset voltage; and when the electric quantity of the battery is less than the preset electric quantity, it is determined that the output voltage of the battery is less than the preset voltage. A correspondence between the preset electric quantity and the preset voltage may be pre-calibrated and stored.

In a possible implementation, the method further includes:

controlling, when a temperature detection value of a temperature sensor is lower than a preset threshold, the first end of the switch circuit to be in communication with the third end of the switch circuit, to enable the boost circuit to perform boost conversion on the output voltage of the battery. The boosted voltage is used to supply power to the Smart PA, to ensure that the Smart PA can still work normally in a low-temperature environment.

In summary, by using the method provided in this embodiment of this application, when an output voltage of a battery is greater than or equal to a preset voltage, the battery directly supplies power to a Smart PA; and when the output voltage of the battery is less than the preset voltage, a Boost circuit first boosts the output voltage of the battery, and then supplies power to the Smart PA by using the boosted voltage, to ensure that a voltage at an input end of the Smart PA is always greater than or equal to the preset voltage, that is, always greater than a minimum voltage required by the Smart PA to maintain normal working, to prevent the Smart PA from being triggered to stop working due to an insufficient input voltage. Therefore, in the solution of this application, a case such as noise or interruption can be prevented from occurring in an audio playback scenario when an electric quantity of the battery is low or an electronic device is in a low-temperature environment, thereby improving listening experience of a user.

In this application, "at least one" refers to one or more, and "a plurality of" refers to two or more. The term "and/or" is used for describing an association between associated objects and representing that three associations may exist. For example, "A and/or B" may indicate that only A exists, only B exists, and both A and B exist, where A and B may be singular or plural. The character "/" in this specification generally indicates an "or" relationship between the associated objects. "At least one of the following" or a similar expression thereof refers to any combination of these items, including one item or any combination of a plurality of items. For example, at least one of a, b, or c may represent a, b, c, "a and b", "a and c", "b and c", or "a, b, and c", where a, b, and c may be singular or plural.

The foregoing embodiments are merely intended for describing the technical solutions of this application, but not for limiting this application. It should be understood by a person of ordinary skill in the art that although this application has been described in detail with reference to the foregoing embodiments, modifications can be made to the technical solutions described in the foregoing embodiments, or equivalent replacements can be made to some technical features in the technical solutions, without departing from the spirit and scope of the technical solutions of the embodiments of this application.

What is claimed is:

1. An electronic device, wherein the electronic device comprises: a battery, a switch circuit, a boost circuit, a smart power amplifier, an inverter circuit, a power transmit coil, a speaker, and a controller;

the battery is connected to a first end of the switch circuit, a second end of the switch circuit is connected to an input end of the smart power amplifier, a third end of the switch circuit is connected to an input end of the boost circuit, an output end of the boost circuit is connected to the input end of the smart power amplifier and the input end of the inverter circuit, and an output end of the smart power amplifier is connected to the speaker;

the boost circuit is configured to perform boost conversion on an output voltage of the battery and is further configured to perform boost conversion on the output voltage of the battery and send the output voltage after the boost conversion to the inverter circuit;

an output end of the inverter circuit is connected to the power transmit coil;

the power transmit coil is configured to convert an alternating current outputted by the inverter circuit into an alternating magnetic field; and the controller is configured to control, in a case that the output voltage of the battery is greater than or equal to a preset voltage, the first end of the switch circuit to be in communication with the second end of the switch circuit; and control, in a case that the output voltage of the battery is less than the preset voltage, the first end of the switch circuit to be in communication with the third end of the switch circuit, wherein the preset voltage is greater than a minimum working voltage of the smart power amplifier.

2. The electronic device according to claim 1, wherein the switch circuit comprises a single pole double throw switch;

a movable end of the single pole double throw switch is connected to the first end of the switch circuit, a first non-movable end of the single pole double throw switch is connected to the second end of the switch circuit, and a second non-movable end of the single pole double throw switch is connected to the third end of the switch circuit; and the controller is further configured to control, in a case that the output voltage of the battery is greater than or equal to the preset voltage, the movable end to be in communication with the first non-movable end; and control, in a case that the output voltage of the battery is less than the preset voltage, the movable end to be in communication with the second non-movable end.

3. The electronic device according to claim 1, wherein the switch circuit comprises a first switch and a second switch;

a first end of the first switch is connected to the second end of the switch circuit, a second end of the first switch and a second end of the second switch are connected to the first end of the switch circuit, and a first end of the second switch is connected to the third end of the switch circuit; and the controller is further configured to control, in a case that the output voltage of the battery is greater than or equal to the preset voltage, the first switch to be on, and the second switch to be off; and control, in a case that the output voltage of the battery is less than the preset voltage, the first switch to be off, and the second switch to be on.

4. The electronic device according to claim 1, wherein in a case that an output volume of the speaker is a maximum volume, a divided voltage on a transmission line between the smart power amplifier and the battery is a first voltage, and the preset voltage is greater than or equal to a sum of the minimum working voltage of the smart power amplifier and the first voltage.

5. The electronic device according to claim 1, wherein the preset voltage is in a positive correlation with an output volume of the speaker.

6. The electronic device according to claim 1, wherein the boost circuit comprises an inductor, a diode, a third switch, and a capacitor; and
a first end of the inductor is connected to the third end of the switch circuit, a second end of the inductor is connected to a first end of the third switch and an anode of the diode, a cathode of the diode is connected to the output end of the boost circuit and a first end of the capacitor, and a second end of the third switch and a second end of the capacitor are grounded.

7. The electronic device according to claim 6, wherein the controller is further configured to control, after controlling the first end of the switch circuit to be in communication with the third end of the switch circuit, the third switch to enable the output voltage of the boost circuit to be greater than or equal to the preset voltage.

8. The electronic device according to claim 1, wherein the controller is further configured to determine, in a case that an electric quantity of the battery is greater than or equal to a preset electric quantity, that the output voltage of the battery is greater than or equal to the preset voltage; and determine, in a case that the electric quantity of the battery is less than the preset electric quantity, that the output voltage of the battery is less than the preset voltage.

9. The electronic device according to claim 1, wherein the electronic device further comprises a temperature sensor; and
the controller is further configured to control, in a case that a temperature detection value of the temperature sensor is lower than a preset threshold, the first end of the switch circuit to be in communication with the third end of the switch circuit.

10. A power supply method for a smart power amplifier, applied to an electronic device, wherein the electronic device comprises a battery, a switch circuit, a boost circuit, an inverter circuit, a power transmit coil, a smart power amplifier, and a speaker; the battery is connected to a first end of the switch circuit, a second end of the switch circuit is connected to an input end of the smart power amplifier, a third end of the switch circuit is connected to an input end of the boost circuit, an output end of the boost circuit is connected to the input end of the smart power amplifier and the input end of the inverter circuit, and an output end of the smart power amplifier is connected to the speaker; the boost circuit is configured to perform boost conversion on an output voltage of the battery and is further configured to perform boost conversion on the output voltage of the battery and send the output voltage after the boost conversion to the inverter circuit; an output end of the inverter circuit is connected to the power transmit coil; the power transmit coil is configured to convert an alternating current outputted by the inverter circuit into an alternating magnetic field; and the method comprises:
controlling, in a case that the output voltage of the battery is greater than or equal to a preset voltage, the first end of the switch circuit to be in communication with the second end of the switch circuit, wherein the preset voltage is greater than a minimum working voltage of the smart power amplifier; and
controlling, in a case that the output voltage of the battery is less than the preset voltage, the first end of the switch circuit to be in communication with the third end of the switch circuit.

11. The power supply method according to claim 10, wherein in a case that an output volume of the speaker is a maximum volume, a divided voltage on a transmission line between the smart power amplifier and the battery is a first voltage, and the preset voltage is greater than or equal to a sum of the minimum working voltage of the smart power amplifier and the first voltage.

12. The power supply method according to claim 10, further comprising:
determining the preset voltage according to an output volume of the speaker, wherein the preset voltage is in a positive correlation with the output volume of the speaker.

* * * * *